May 21, 1968 AKIHIKO SATO 3,384,829

SEMICONDUCTOR VARIABLE CAPACITANCE ELEMENT

Filed Jan. 28, 1964

INVENTOR.
AKIHIKO SATO

BY

Hopgood & Calimafde
ATTORNEYS

3,384,829
SEMICONDUCTOR VARIABLE CAPACITANCE ELEMENT

Akihiko Sato, Tokyo, Japan, assignor to Nippon Electric Company Limited, Tokyo, Japan, a corporation of Japan Filed Jan. 28, 1964, Ser. No. 340,656
Claims priority, application Japan, Feb. 8, 1963, 38/6,559
6 Claims. (Cl. 330—7)

ABSTRACT OF THE DISCLOSURE

A variable capacitance semiconductor device similar to the varactor. A semiconductor wafer is provided with an electrode on a major surface of the wafer and two ohmic contacts at spaced points on the edge of the wafer. A relatively high rate of capacitance change is produced between the electrode and the contacts when a relatively small change in bias potential is applied between the contacts.

This invention relates to semiconductor devices and more particularly to such devices wherein changes in capacitance can be effected by changing the potentials applied to the devices.

The electrostatic capacitance of a diode has the inherent characteristic of changing non-linearly with reverse voltage applied. This characteristic is largely utilized in parametric amplification and frequency multiplication applications. Such a diode, hereinafter referred to as a variable capacitance element, usually employs a semiconductor PN junction and the capacitance changes in accordance with the following equation:

$$C=C_o\left(\frac{\phi_o}{V+\phi_o}\right)\frac{1}{n}$$

Where $C_o$=capacitance at zero volts,
$\phi_o$=diffused potential,
$n$=2 in a step-junction, and
$V$=applied impressed voltage in the reverse direction.

In the case of certain circuit applications, however, it is desirable that the capacitance show very large changes in opposition to the bias. Two methods are available to achieve this. One is known as the "retrograded junction," and involves a junction in which the impurity density of the diode on the base side follows the complementary error (*erfc*); the other is known as the "surface varactor."

The surface varactor does not employ a PN junction within a crystal, but effectively varies the capacitance by the carrier distribution being changed with the applied potential.

It is an object of this invention to provide an improved semiconductor device which retains the advantages of the surface varactor and which also has desirable electrical characteristics not obtainable from such varactor.

All of the objects, features and advantages of this invention and the manner of attaining them will become more apparent and the invention itself will be best understood by reference to the following description of an embodiment of the invention taken in conjunction with the accompanying drawing, in which.

Figure 1:
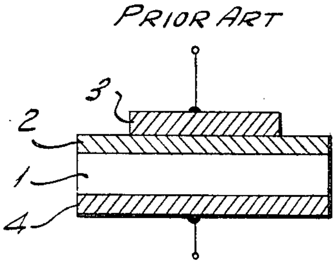
FIG. 1 shows the structure of a conventional varactor.

Referring now to FIG. 1, there is shown a conventional surface varactor having an oxide layer 2, formed on a semiconductor crystal 1, and two electrodes 3 and 4.

Figure 2:
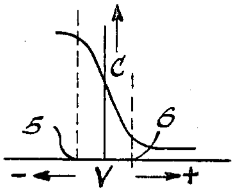
FIG. 2 illustrates the capacity changes with voltage applied, for the varactor of FIG. 1.

If the capacitance is measured after applying a voltage between the two electrodes 3 and 4, the varactor shows the characteristics as shown in FIG. 2 when the semiconductor crystal has a P-type conductivity. The applied voltage V is marked "positive" when the electrode 3 is positive with respect to the electrode 4, and "negative" when it is negative with respect to the electrode 4.

Still referring to FIG. 2, when the applied voltage is "negative," holes within the crystal 1 will be gathered on the crystal surface, but no current will flow since the holes will be inhibited by the insulating oxidized layer 2. The varactor will then act as if it were a condenser having electrodes on both sides of the oxidized layer 2.

When the applied voltage V is "positive," holes within the crystal will be repelled from the surface, thereby forming a space-charge layer on the crystal surface. Since the capacitance of this space-charge layer is in series with the capacitance of the oxidized layer, the combined capacitance will be reduced. As shown in FIG. 2, the capacitance will sharply decrease in the positive direction of V.

The range of voltage in which the capacitance changes, is determined by the resistivity of the crystal and thickness of the oxidized layer. This range of voltage is generally of the order of 1 to 2 volts. The surface varactor has numerous advantages, including sharp changes in capacitance against the bias voltage as well as ease of manufacture.

Figure 3:
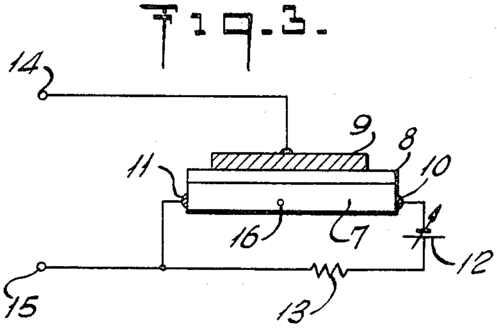
FIG. 3 shows one embodiment of the present invention.

FIG. 3 shows an embodiment of the invention in the form of a novel semiconductor structure having novel variable capacitance characteristics. This device utilizes certain features of the conventional varactor, but is a considerable improvement thereover. In FIG. 3, the numeral 7 indicates a semiconductor crystal body having an insulating oxidized layer 8 thereon and an electrode 9 on the layer 8 as in the case of a conventional surface varactor. Unlike such varactor, however, two ohmic contact terminals 10 and 11 are provided at the opposite ends and in the transverse direction of the semiconductor wafer body 7 so that direct current may flow between the terminals 10 and 11 through a D.C. control power source 12 and a resistor 13.

The principle of the operation of the device of this invention is as follows. If the control power source 12 has zero voltage and the semiconductor crystal 7 is of P-type conductivity, the characteristic at the terminals 14 and 15, will be the same as that of the conventional varactor, as indicated by the curve 17, in FIG. 4.

However, if the polarity of the control power source 12 is considered in the direction shown in FIG. 3, and if current is made to flow from terminal 11 to terminal 10 within the semiconductor crystal body 7, then there will occur a voltage drop due to this current. The potential at an arbitrary point 16 taken near the center of the crystal will be lower than that at the terminal 11 and higher than that at the terminal 10.

Figure 4:
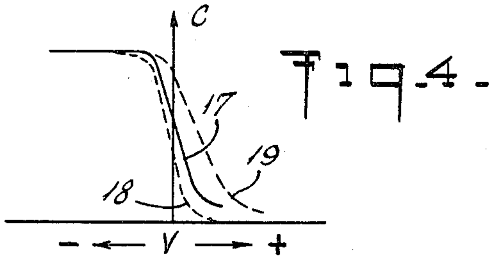
FIG. 4 illustrates the variable capacitance characteristic versus voltage applied across the control terminals of the device of FIG. 3.

Even if the portion near the terminal 11 is within the range of a constant high capacitance, as shown in FIG. 4, due to a given bias applied to the external terminals 14 and 15, the point 16 is in the range where the capacitance changes sharply and the portion near the terminal 10 is in the range of almost constant low capacitance.

More specifically, the capacitance across the external terminals 14 and 15 will be an integrated capacitance of the various portions described above. Accordingly, the voltage capacitance characteristics between the external terminals 14 and 15 can be represented by the curve 18 in FIG. 4, showing that the range of change in capacitance is slightly shifted in the direction where the bias is lower.

It will be observed that in addition to a shift of the characteristic as evidenced by the curve 18, sharper changes in the capacitance are produced, i.e. the slope of the linear portion of the curve 18 is steeper than the curve 17. Moreover, if the polarity of the control power source 12 is reversed, the range of changes in the capacitance will shift to the direction where the bias is higher, as seen by the curve 19 of FIG. 4.

The present device is capable of performing the following two functions: (a) change in absolute value of capacitance by varying the voltage of the control power source 12, with the external bias at a voltage of zero, and (b) variation of the rate of change in the capacity against the external bias.

Figure 5:
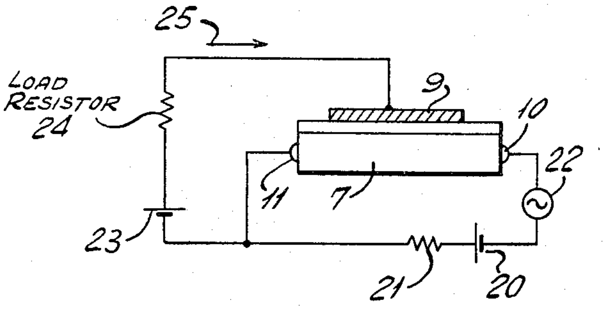
FIG. 5 illustrates an example of a circuit which employs the device of FIG. 3.

With a method of control thus added to the conventional varactor, a wider field of application is accordingly possible. If an A.C. signal source 22 is inserted into the circuit connecting the power source 20 and the resistor 21 to the terminals 10 and 11 of the device, as shown in FIG. 5, and if the power source 23 and load resistor 24 are connected to the external terminal 9, then it will be seen that an external signal current 25 will flow in response to the A.C. signal. Thus, an amplified A.C. signal voltage may be obtained across the load resistor 24. This is achieved by causing current to flow in the semiconductor crystal body and utilizing the resulting potential drop. It is to be observed that if the current is high, there will be a corresponding loss of power. To reduce the power loss, it is necessary to make the crystal body of semiconductor 7 in FIG. 3 as thin as possible.

Figure 6:
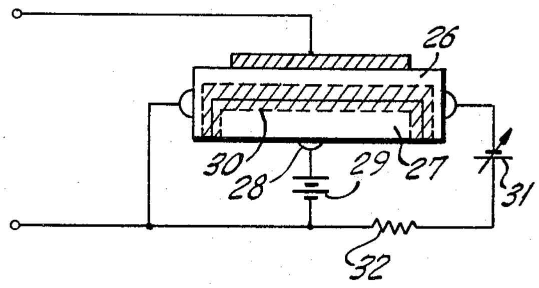
FIGS. 6 and 7 illustrate further embodiments of the invention in which the basic semiconductor body comprises a composite structure having different conductivity types.

This slight disadvantage, however, can be eliminated by the structure shown in FIG. 6. In this figure, the semiconductor crystal body is not of a single conductivity type but a composite type of P and N type conductivities, the region 26 being of P type and the region 27 being of N type. This N type region 27 is provided with a contact terminal 28, and a D.C. voltage 29 is applied thereto. By reason of this connection, a space-charge region 30 extends on both sides of the PN junction. Current due to the controlling voltage 31 will flow through the region outside the space-charge layer of the P type region 26. If the voltage 29 is made sufficiently high, there will be a sharp increase in the resistance of the portion through which the current flows. As a result, the power loss from the controlling voltage 31 is substantially reduced to an extremely low value.

Figure 7:
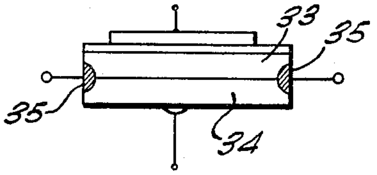

Many types of contruction than that shown in FIG. 6 are of course possible. As an example, FIG. 7 shows a construction with a P type region 35 on P and N layers 33 and 34, respectively, secured by bonding or by other suitable means.

Although the explanation has referred to various embodiments chiefly from the standpoint of construction, the present invention is not limited to these embodiments. It is apparent to those skilled in the art that silicon, germanium and other semiconductors may be used as the crystal body and that oxides such as silicon oxide and other insulators may be used as the insulating layer within the scope and spirit of the present invention. Accordingly, it is to be understood that the description is made only by way of example and not as a limitation of the scope of the invention as set forth in the objects thereof and in the accompanying claims.

What is claimed is:

1. A semiconductor device comprising
a semiconductor body in the form of a thin wafer,
a layer of oxide on a major surface of said wafer,
an output electrode on the surface of said oxide layer,
a pair of input circuit terminals located at spaced points on the edge of said wafer, said body comprising a homogeneous mass of semiconductive material extending from one of said terminals to the other, means for connecting a bias potential between said terminals, and said device comprising a variable capacitor wherein the absolute capacitance and the rate of change of capacitance measurable between said electrode and one of said terminals varies depending upon the polarity of said potential applied between said terminals and the value of said potential.

2. A semiconductor device comprising
an electrode output,
a thin oxide layer film in contact with said electrode,
a semiconductor wafer having input circuit terminal contacts located at spaced points thereon for impressing a bias potential on said wafer,
one surface of said wafer being in intimate physical contact with said oxide layer,
means for connecting a bias potential between said contacts,
and the recited device comprising a variable capacitor wherein the absolute capacitance and the rate of change of capacitance measurable between said electrode and one of said terminal contacts varies depending upon the polarity and value of said bias potential impressed between said terminal contacts.

3. The invention described in claim 2 wherein said wafer further includes a sandwich-like structure including a first layer comprising said homogeneous body having a given type conductivity and a second layer having an opposite type conductivity, one of said terminal contacts being in physical contact with both of said first and second layers at the edge of said structure, and the other of said terminal contacts also being in physical contact with both of said first and second layers at the edge of said structure.

4. A variable capacitance semiconductor device comprising,
a thin semiconductor body having an oxide layer on a major surface thereof and an electrode on said layer,
said body being made up of a first section having a given type conductivity and a second section having an opposite type conductivity, whereby a space charge region is formed between said sections, said first section being in intimate contact with oxide layer,
first and second terminals located at spaced points on said first section of said body and means for impressing a biasing potential between said terminals,
a third terminal located on a major surface of said second section so that a D.C. potential may be impressed between said third terminal and said first terminal,
and variable capacitor in said absolute capacitance and the rate of change of capacitance measurable between said first terminal and said electrode being varied in accordance with the polarity and value of the biasing potential applied between said first and second terminals.

5. A semiconductor amplifying device comprising
a semiconductor body in the form of a thin wafer,
a layer of oxide on a major surface of said wafer,
an output electrode on the surface of said oxide layer,
a pair of input terminals located at spaced points on the edge of said wafer,
a load impedance connected in series with a first potential source between said electrode and one of said terminals,
and a second potential source, a resistor and an input signal source connected in series between said terminals, whereby an amplified version of said signal is produced across said load impedance.

6. A semiconductor device comprising
a thin semiconductor body having an oxide layer electrode on a major surface thereof and an electrode on said layer, said body being made up of a first section having a given type conductivity and a second section having an opposite type conductivity whereby a space charge region is formed between said sections, said first section being in intimate contact with said electrode, first and second terminals located at spaced points on said first section of said body, a third terminal located on a major surface of said second section, means for reducing the power loss inherent in the operation of said device including said second section and a D.C. voltage source connected between said third terminal and one of said terminals of said first section, and a biasing potential connected between said first and second terminals, and in said variable capacitor the absolute capacitance and the rate of change of capacitance measurable between said electrode and said first terminal being varied in accordance with variations in the polarity and value of said biasing potential.

References Cited

UNITED STATES PATENTS

| | | | |
|---|---|---|---|
| 3,206,670 | 9/1965 | Atalla | 323—93 |
| 3,309,586 | 3/1967 | Kleinknecht | 317—235 |

ROY LAKE, *Primary Examiner.*

NATHAN KAUFMAN, *Examiner.*